United States Patent [19]
Lee

[11] Patent Number: 5,914,204
[45] Date of Patent: Jun. 22, 1999

[54] PHASE SHIFTING MASK AND A MANUFACTURING METHOD THEREFOR

[75] Inventor: Jun-Seok Lee, Seoul, Rep. of Korea

[73] Assignee: LG Semicon Co, Ltd, Chungcheongbuk-do, Rep. of Korea

[21] Appl. No.: 08/964,010

[22] Filed: Nov. 4, 1997

[30] Foreign Application Priority Data

Nov. 4, 1996 [KR] Rep. of Korea ............ 96/51814

[51] Int. Cl.$^6$ ............................................. G03F 9/00
[52] U.S. Cl. ............................................. 430/5
[58] Field of Search .................... 430/5, 322, 324

[56] References Cited

U.S. PATENT DOCUMENTS 5,328,807  7/1994  Tanaka et al. .................. 430/5
5,397,663  3/1995  Uesawa et al. .................. 430/5

OTHER PUBLICATIONS

Levenson, M., "Improving Resolution in Photolithography with a Phase–Shifting Mask," IEEE Transactions on Electron Devices, vol. ED29, No. 12 (Dec. 1982) pp. 57–60.

*Primary Examiner*—S. Rosasco

[57] ABSTRACT

A phase shifting mask and manufacturing method therefor has an improved step coverage by forming a shielding layer pattern by way of a phase shifting layer. The phase shifting mask includes an optically transmitting substrate, and a transmitting pattern and a non-transmitting pattern formed onto the substrate, in which the transmitting pattern has a linewidth more than a limit resolution with respect to an exposure light, and the non-transmitting pattern has a line width below the limit resolution with respect to the exposure light.

18 Claims, 11 Drawing Sheets

PHASE SHIFTING MASK AND A MANUFACTURING METHOD THEREFOR

FIELD OF THE INVENTION

The present invention relates to a phase shifting mask, and more particularly to a phase shifting mask unaffected by step coverage due to a shielding pattern and a method for manufacturing the same.

BACKGROUND OF THE INVENTION

Generally, a photolithography process (widely applied during the manufacture of semiconductor devices) utilizes a photo mask which has a portion for transmitting light and a portion for blocking the light to provide the semiconductor device shaped as desired. Such a photo mask is formed by a shielding pattern and a transmitting pattern to allow for selective exposure.

However, a light diffraction phenomenon becomes problematical with the increase of pattern density, which restricts improvement of resolution.

Therefore, a process for increasing the resolution by using a phase shifting mask has been studied in various fields.

A technique for utilizing the phase shifting mask combines a transmitting region which transmits light unaltered with a shifting transmitting region which shifts the light by 180° as it transmits the light thereby preventing degradation of resolution between the shielding pattern and transmitting region.

In association with such a phase shifting mask, modified masks applying a phase difference of light have been suggested to expand the optical resolution limit.

Starting from a Levenson's alternate type phase-shifting mask, a rim type phase shifting mask has been suggested by Nitayama et al. for improving the resolution limit of a contact hole.

Hereinbelow, the conventional phase shifting mask will be described with reference to accompanying drawings.

FIGS. 1A to 1D are sectional views showing a process for manufacturing one example of a conventional phase shifting mask which is of the alternate type.

Briefly, the alternate type phase shifting mask transmits through two patterns except where the interposed shielding pattern exists. The light having passed through the two transparent patterns has opposite amplitudes.

Figure 1A:
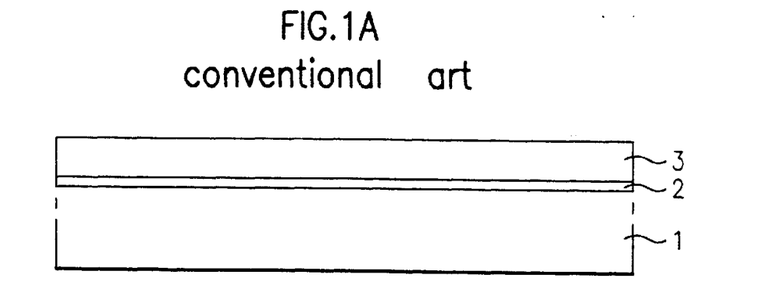
FIGS. 1A to 1D are sectional views showing a process for manufacturing one example of a conventional phase shifting mask.

First, as shown in FIG. 1A, an etch-stopper layer 2 and a shielding layer 3 are sequentially formed on a transmitting substrate 1. At this time, shielding layer 3 is generally formed of chrome and has at least a thickness sufficient to obtain a perfect shielding effect.

Figure 1B:
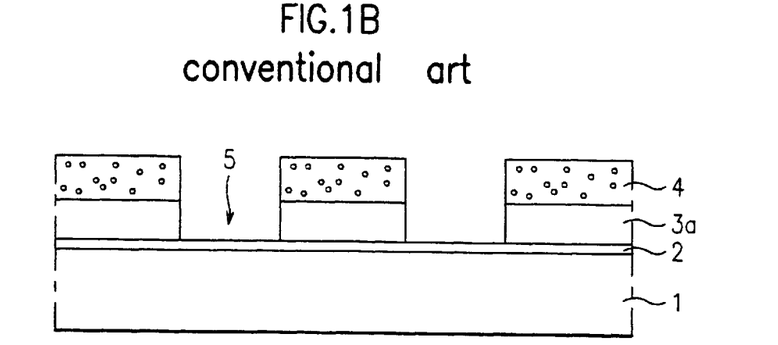

Referring to FIG. 1B, a resist 4 is deposited onto shielding layer 3, and is patterned via an electron beam radiation and development process. Then, shielding layer 3 is selectively etched via an etching process using patterned resist 4 as a mask, thereby providing a shielding layer pattern 3a having a plurality of opening areas 5.

Figure 1C:
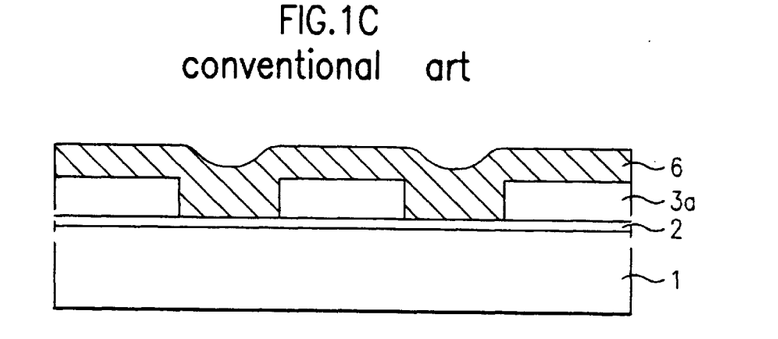

As shown in FIG. 1C, a phase shifting layer 6 is formed on the whole surface of the resultant structure including shielding layer pattern 3a. Step coverage problems arise where the phase shifting layer 6 fills the apertures in the shielding layer pattern 3a.

Figure 1D:
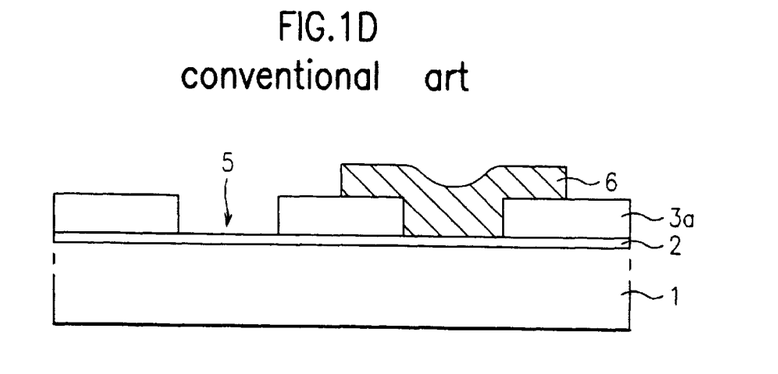

Referring to FIG. 1D, phase shifting layer 6 is selectively removed to be alternately formed on opening areas 5.

Figure 2A:
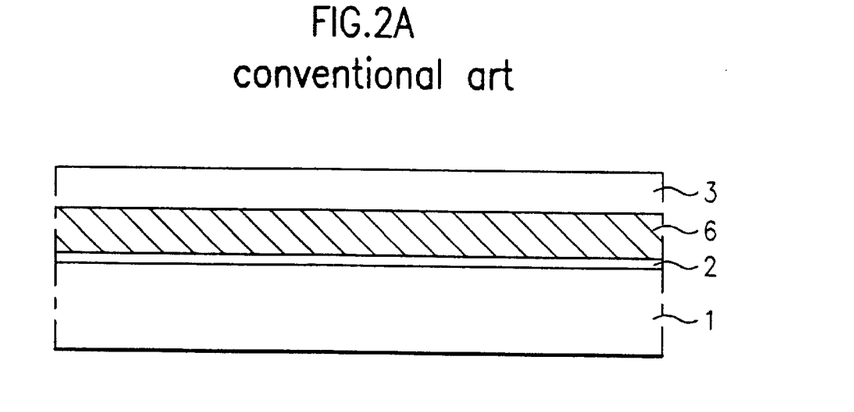
FIGS. 2A to 2C are sectional views showing a process for manufacturing another example of the conventional phase shifting mask.
Figure 2B:
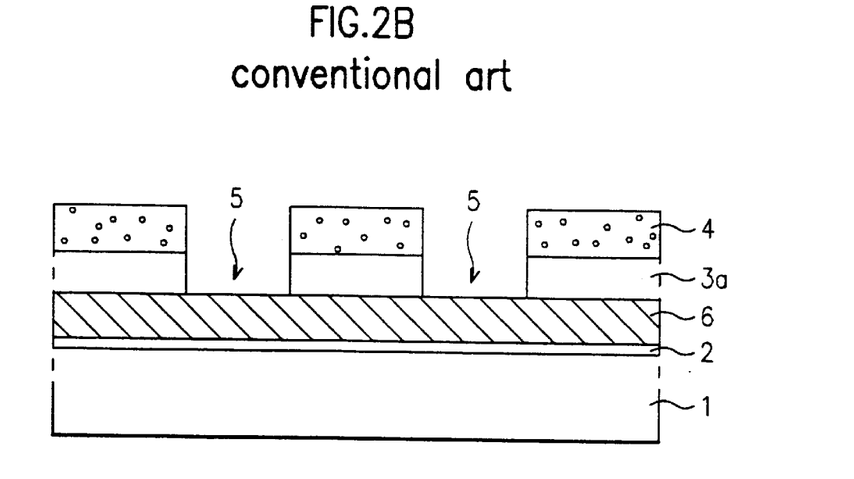
Figure 2C:
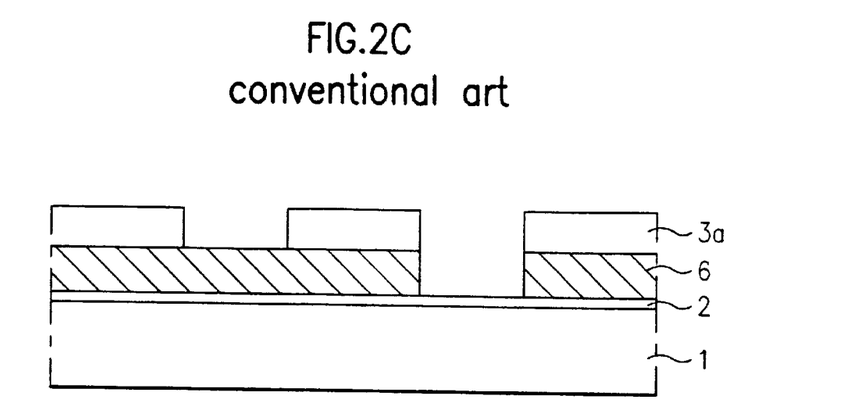

FIGS. 2A to 2C are sectional views showing a process for manufacturing another example of the conventional phase shifting mask which also is of the alternate type.

Referring to FIG. 2A, an etch-stopper layer 2, a phase shifting layer 6 and a shielding layer 3 are sequentially formed on a transmitting substrate 1.

As shown in FIG. 2B, a resist 4 is deposited onto shield layer 3, and is patterned via the electron beam radiation and development process. Then, shielding layer 3 is etched via the etching process using patterned resist 4 as a mask, thereby forming a shielding layer pattern 3a having a plurality of opening areas 5.

Referring to FIG. 2C, phase shifting areas are alternately defined on plurality of opening areas 5. Thereafter, phase shifting layer 6 of opening areas 5, excluding opening areas 5 defined by the phase shifting region, is selectively removed. Then, the phase shifting mask having opposite phases of light having passed through adjacent opening areas 5 is formed.

Figure 3:
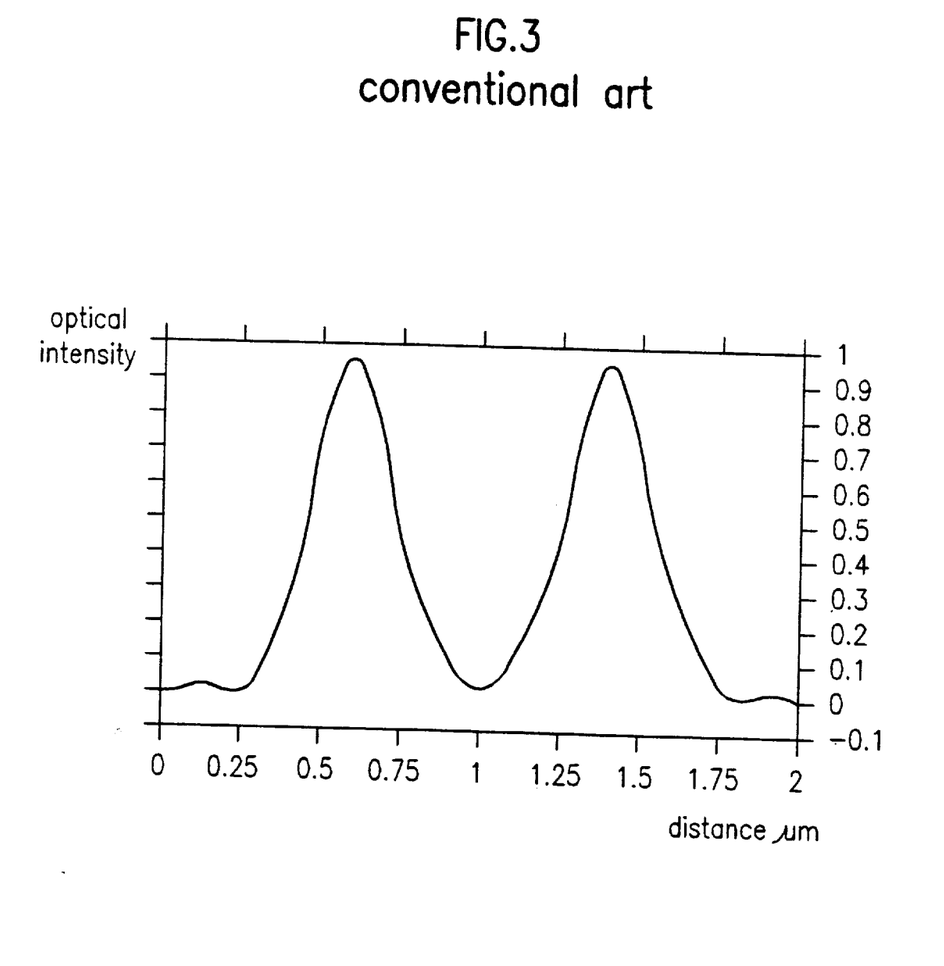
FIG. 3 shows a profile diagram representing intensity of light having passed through the phase shifting mask shown in FIG. 2C.

FIG. 3 shows a profile diagram representing intensity of the light having passed through the opening areas of the conventional phase shifting mask shown in FIG. 2C. Here, the intensity profile of the light having passed through the opening area formed with the phase shifting layer and the opening area without being formed with the phase shifting layer is steep.

In other words, the amplitude of the light having passed through the adjacent opening areas is exposed under the opposite state to prevent appearance of the abnormal pattern due to a side lobe at the shielding layer pattern region where two opening areas overlap with each other.

FIGS. 4A to 4D are sectional views showing a process for manufacturing still another example of the conventional phase shifting mask, which is the rim type phase shifting layer suggested by Nitayama et al. for improving the resolution limit of a photoresist hole.

In a rim type phase shifting mask, the phase shifting region is formed to have a phase opposite to the phase of light that has passed through the transmitting region onto a rim portion of the transparent area, which is the opening area between shielding regions. Here, the light having passed through the phase shifting region induces an offset interference with the light having passed through the transmitting region so that the abnormal pattern caused by a side lobe is prevented and the precise photoresist hole can be realized.

Figure 4A:
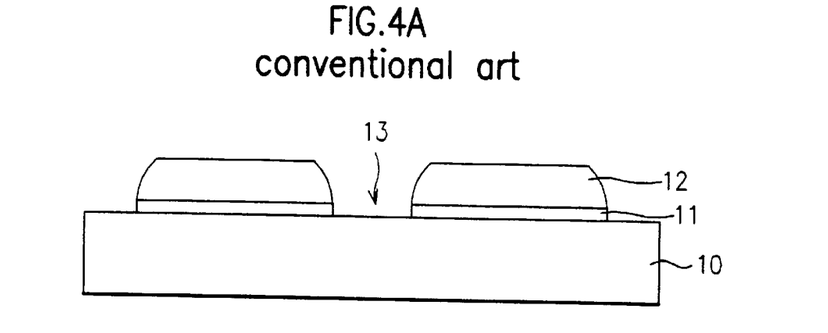
FIGS. 4A to 4D are sectional views showing a process for manufacturing still another example of the conventional phase shifting mask.

First, as shown in FIG. 4A, a shielding layer 11 and a resist 12 are sequentially deposited on a transmitting substrate 10. Then, a region forming the shielding layer pattern is defined via the electron beam radiation and development process to pattern the resist 12. Shielding layer 11 is selectively removed via the etching process using patterned resist 12 as a mask to form a shielding layer pattern 11 having a plurality of opening areas 13. The shielding layer pattern 11 is formed of chrome.

Figure 4B:
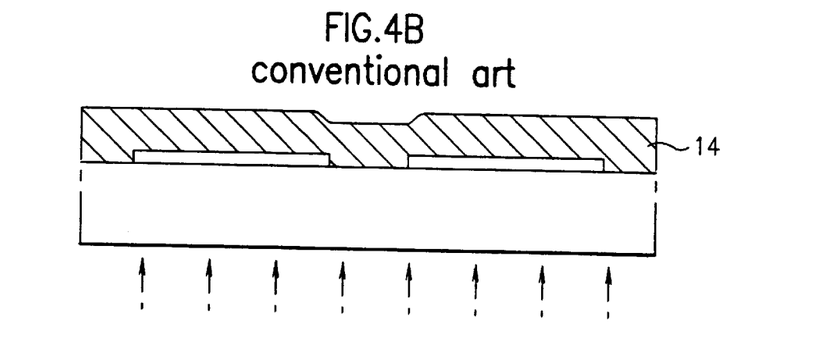

Referring to FIG. 4B, after resist 12 is removed, a poly-methyl-methacrylate (PMMA) layer to be used as a phase shifting layer 14 is deposited on the whole surface of the resultant structure including shielding layer pattern 11, of which the rear side is exposed with ultraviolet rays.

Figure 4C:
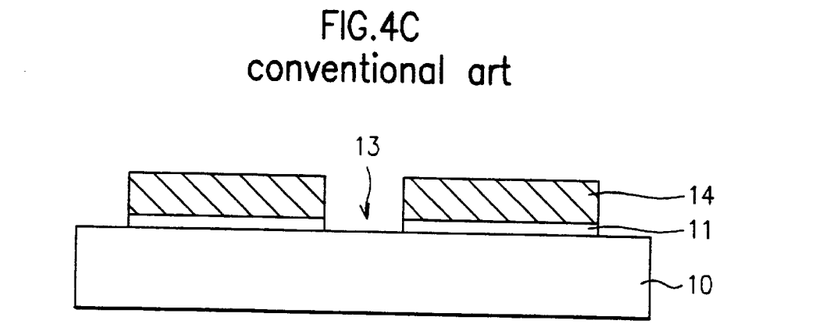

In FIG. 4C, the PMMA to be used as phase shifting layer 14 is developed. At this time, since the PMMA is of a positive type, only the portion radiated by the ultraviolet rays is developed to leave the PMMA on shielding layer pattern 11. That is, only the PMMA formed onto opening area 13 is developed.

Figure 4D:
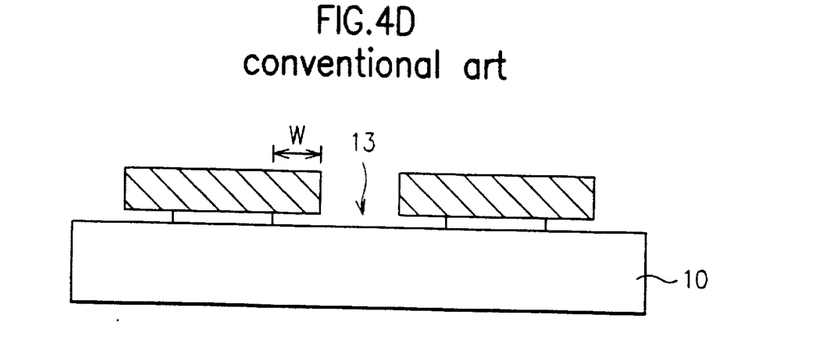

Referring to FIG. 4D, shielding layer pattern 11 at the rim portion of phase shifting layer 14 is partially removed by using a wet etching method. At this time, a width W of phase shifting layer 14 corresponding to the range of eliminating shielding layer pattern 11 does not correspond in proportion to the desired pattern resulting from the light transmission, rather its purpose is to sharpen the profile of light having passed through opening area 13. It transmits the light phase-shifted by 180±10°, which is opposite in phase to the light passing through opening area 13, thereby increasing the resolution of the phase shifting mask.

Figure 5:
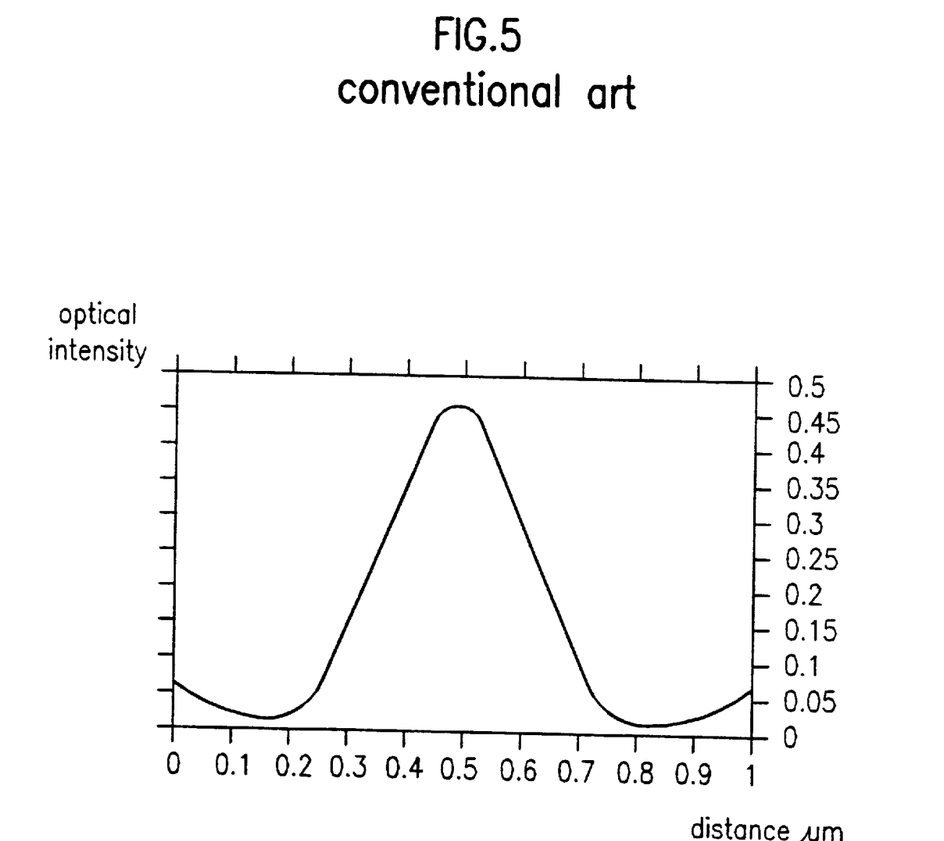
FIG. 5 shows a profile diagram representing intensity of light having passed through the phase shifting mask shown in FIG. 4D.

FIG. 5 shows a profile diagram representing intensity of the light having passed through the rim type phase shifting mask shown in FIG. 4D, in which the light passing through opening area 13 is offset with the light passing through the rim portion of phase shifting layer 14 in contact with opening area 13, so that the light intensity having passed through opening area 13 is steep. In other words, the patterning can be accurately performed in the perpendicular direction when forming the photoresist pattern.

By the conventional alternate type phase shifting mask and rim type phase shifting mask, the side lobe can be prevented and the steep photoresist pattern can be formed as compared with the general photo mask which is employed as the photo-developing reticle. But there are problems as discussed below.

First, since the shielding layer pattern is formed onto the substrate in addition to the phase shifting layer, the bond stress and the like at the contact portion of the shielding layer pattern and phase shifting layer may deform the phase shifting layer pattern.

Second, the shielding layer pattern is formed by using a light-shielding material such as chrome which exhibits a step coverage problem due to the thickness of the shielding layer pattern. Thus, a phase shifting error can be induced by the step coverage when the phase shifting mask is utilized to expose a wafer.

Third, the wet etching process of the shielding layer pattern of the rim type phase shifting mask must undercut the phase shifting layer, which makes it difficult to precisely form the rim portions of the phase shifting layer, thus retarding reliability.

Fourth, the manufacturing process of the phase shifting mask involves several complicated stages with the consequence of it being highly probable that contaminating particles will be generated, thereby degrading the reliability of the phase shifting mask.

SUMMARY OF THE INVENTION

Accordingly, the present invention is directed to a phase shifting mask and its manufacturing method that substantially obviates one or more of the problems due to limitations and disadvantages of the related art.

An object of the present invention is to provide a phase shifting mask and manufacturing method therefor, wherein a material forming a shielding layer pattern is to be the same as a material forming a phase shifting layer, which eliminates the need for two separate layers and so lessens step coverage.

To achieve these and other advantages and in accordance with the purpose of the present invention, as embodied and broadly described, there is provided a phase shifting mask including an optically transparent transmitting substrate, and a checkerboard shielding layer pattern formed by a plurality of holes in a phase shifting layer and a plurality of small phase shifting layer patterns constituting a checkerboard arrangement on the transmitting substrate. Also, an open area is formed to one side of the shielding layer pattern, and a phase shifting layer is formed to the other side of the shielding layer pattern.

In another aspect, the present invention provides a method for manufacturing a phase shifting mask comprising the steps of: forming a phase shifting layer on an optically transparent transmitting substrate; and defining alternating transmitting regions and shielding regions in the phase shifting layer. Thereafter, the phase shifting layer of the shielding region is selectively patterned to form a shielding layer pattern arranged into a checkerboard formed by a plurality of holes in the phase shifting layer having a point symmetry relation and a plurality of small phase shifting layer patterns having the point symmetry relation. At the same time, the phase shifting layer on some of the transmitting regions is selectively removed to provide first transmitting regions, thus leaving second transmitting regions where the shielding layer pattern remains.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF PREFERRED EMBODIMENT

Reference will now be made in detail to the preferred embodiments of the present invention, examples of which are illustrated in the accompanying drawings.

Figure 6:
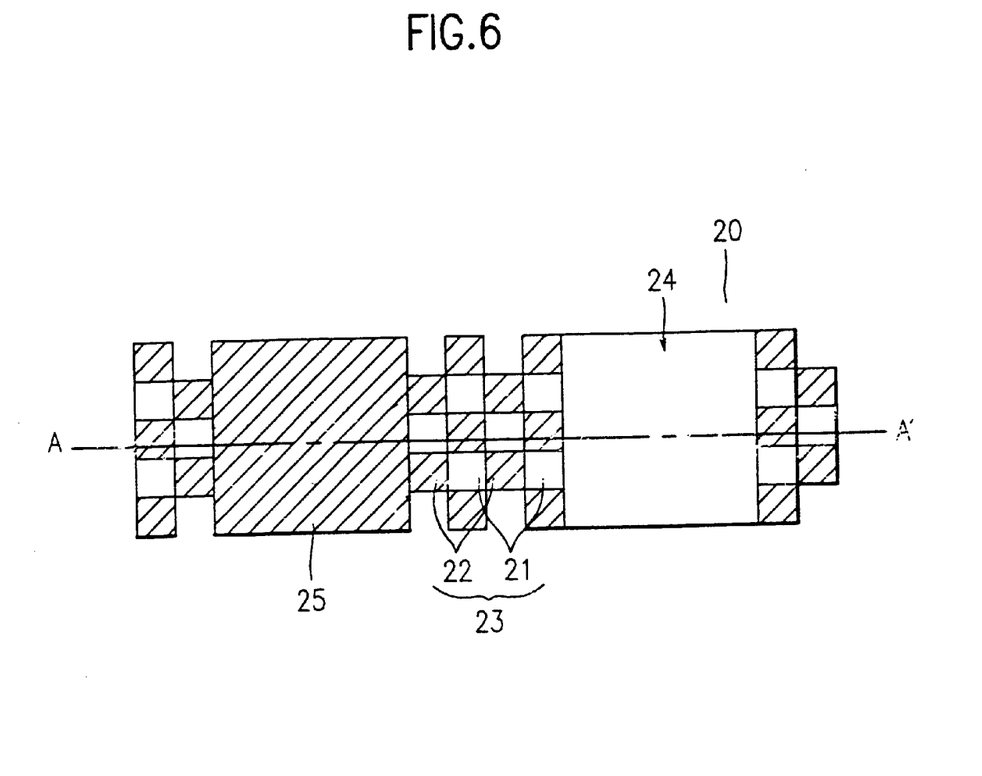
FIG. 6 is a plan view showing a phase shifting mask according to a first embodiment of the present invention.

FIG. 6 is a plan view showing the phase shifting mask according to a first embodiment of the present invention.

To begin with, as shown in FIG. 6, the phase shifting mask according to the first embodiment of the present invention includes an optically-transparent transmitting substrate 20, and a shielding layer pattern 23 formed by holes 21 in the phase shifting material and smaller phase shifting layer patterns 22 which provide a checkerboard arrangement on transmitting substrate 20. Also, an opening area 24 first transmitting region is formed to one side of shielding layer pattern 23, and a phase shifting layer 25 or second transmitting region is formed to the other side of shielding layer pattern 23.

Referring to FIG. 6, transmitting substrate 20 is, e.g., either one of glass or quartz, and shielding layer pattern 23 shaped as a regular square is, for example, one of an oxide (e.g., $SiO_2$), spin on glass (SOG) and photosensitive polymer (e.g., polymethylmethacrylate (PMMA)).

The phase shifting layer pattern 25 on one side of the checkerboard shaped shielding layer pattern 23 can be referred to as a "line" while the opening area on the other side can be referred to as a "space." For a cross-section along the line A–A' of FIG. 6, a sum of the width of one such "line" added to the width of one such "space" is to be smaller than 0.6 μm.

The holes 12 in the phase shifting layer are formed to have a point symmetry state, and phase shifting layer patterns 22 also have the point symmetry state. Respective open holes 21 and phase shifting layer patterns 22 are in the line symmetry state. Here, shielding layer pattern 23 shaped as the checkerboard is formed to have a dimension below a limit of resolution, in which, assuming that the vertical and horizontal lengths of the checkerboard shaped shielding layer pattern 23 are identical to each other and a length of one side of shielding layer pattern 23 is designated by L, length L of one side of shielding layer pattern 23 is written as:

$$L = \frac{0.4\lambda}{N \cdot A} \sim \frac{0.1\lambda}{N \cdot A}$$

where 0.4~0.1 denote exposure constants, a reference symbol λ is an exposure wavelength, and N·A is the numerical aperture of lens. At this time, λ is preferably 365 nm due to using an i-line stopper, and N·A is 0.52. The vertical and horizontal dimensions of shielding layer pattern 23 preferably are to be below 0.3 μm, respectively. At this time, the material constituting the phase shifting layer 25 is, e.g., one of $SiO_2$, SOG or photosensitive polymer, which is identical to that forming the phase shifting layer pattern 22 utilized for shielding layer pattern 23.

Hereinbelow, a process for manufacturing the phase shifting mask according to the first embodiment of the present invention will be described with reference to FIGS. 7A, 7B and 7C.

Figure 7A:
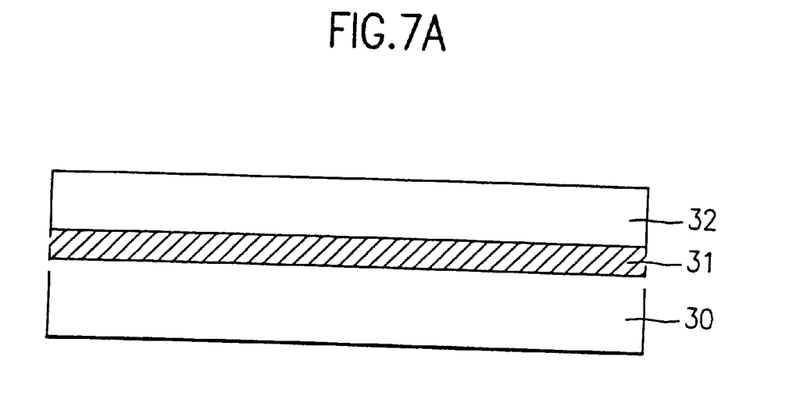
FIGS. 7A to 7C are sectional views showing a process for manufacturing the phase shifting mask, taken along line A–A' of FIG. 6.
Figure 7B:
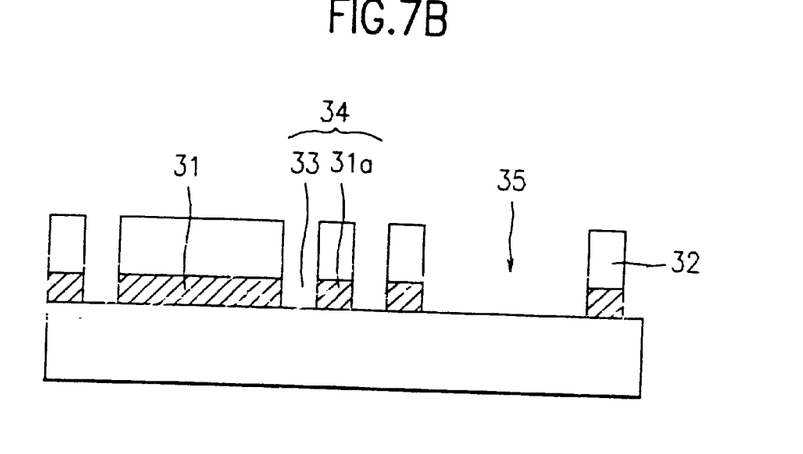
Figure 7C:
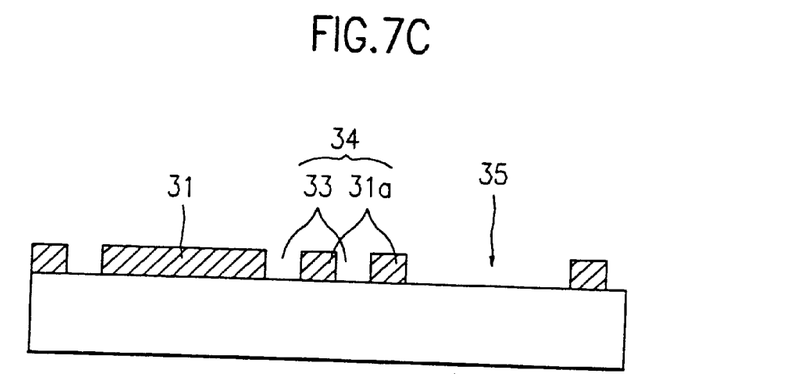

Here, FIGS. 7A to 7C are sectional views showing a process for manufacturing the phase shifting mask, taken along line A–A' of FIG. 6.

First, a phase shifting layer 31 and a resist 32 are sequentially formed on an optically transparent transmitting substrate 30.

As shown in FIG. 7B, an electron beam is selectively radiated to develop resist 32, and a first transmitting region and a shielding layer pattern for selectively exposing light transmitting substrate 30 are defined on resist 32. Then, phase shifting layer 31 is selectively removed via the etching process by using patterned resist 32 as a mask, thereby forming a shielding layer pattern 34 (formed by holes 33 in the phase shifting layer and smaller phase shifting layer patterns 31a) and an opening area 35 (used as the first transmitting region 24) to one side of shielding layer pattern 34. In addition, the unpatterned phase shifting layer 31 at the other side of shielding layer pattern 34 is utilized as the second transmitting region 25.

Referring to FIG. 7C, patterned resist 32 is removed. At this time, shielding layer pattern 34 (formed by the holes 33 and phase shifting layer patterns 31a), while exposing transmitting substrate 30, functions as a light shielding layer. The phase shifting layer holes 33 (formed to expose transmitting substrate 30 and to have 100% light transmissivity and a phase of 0° with respect to the transmitted light) and phase shifting layer pattern 31a (having light transmissivity of 80~100% and shifting the phase with respect to the transmitted light by 180±10°) are provided in the shape of the checkerboard, so that the amplitudes of the two light quantities at the wafer are offset to each other, thus presenting a considerably gradual profile.

In the first embodiment of the present invention, respective holes 33 and phase shifting layer pattern 31a are preferably formed to have dimensions of about 0.05 μm.

As described above, the phase shifting mask according to the first embodiment of the present invention has the alternately formed first transmitting region and second transmitting region which transmit the light of opposite phases to each other. Formed between these regions is the checkerboard of holes and smaller shielding layer patterns. When the material forming the shielding layer pattern and material forming the phase shifting layer employ the PMMA, the phase shifting mask having the same effect can be formed using only the exposure and development process once, via the electron beam radiation, without requiring an etching process.

Figure 8:
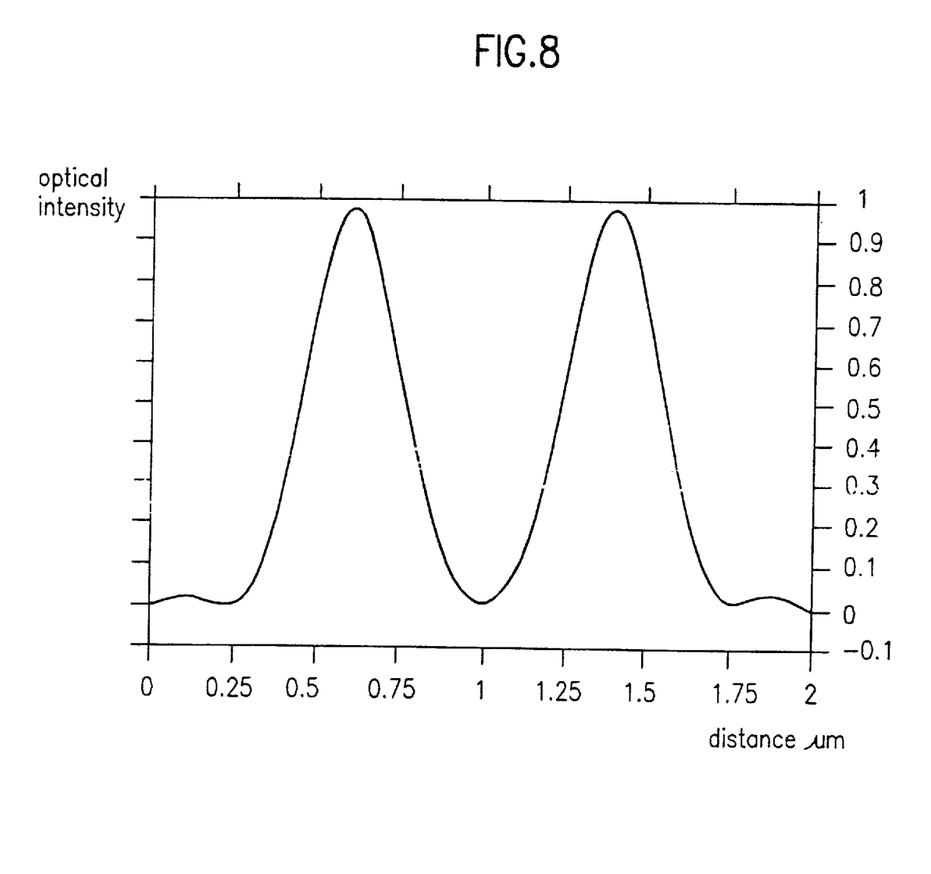
FIG. 8 shows a profile diagram representing intensity of light having passed through the phase shifting mask shown in FIG. 7C.

FIG. 8 shows a profile diagram representing intensity of the light having passed through the phase shifting mask shown in FIG. 7C, which is evaluated by a simulation tool implementing the Fast Aerial Image Method (FAIM).

Here, it can be noted that the phase shifting mask according to the present invention has an effect of representing the light intensity identical to the profile of the light having passed through the conventional alternate type phase shifting mask.

Now, the phase shifting mask and manufacturing method therefor according to a second embodiment of the present invention will be described with reference to FIGS. 9 to 11.

Figure 9:
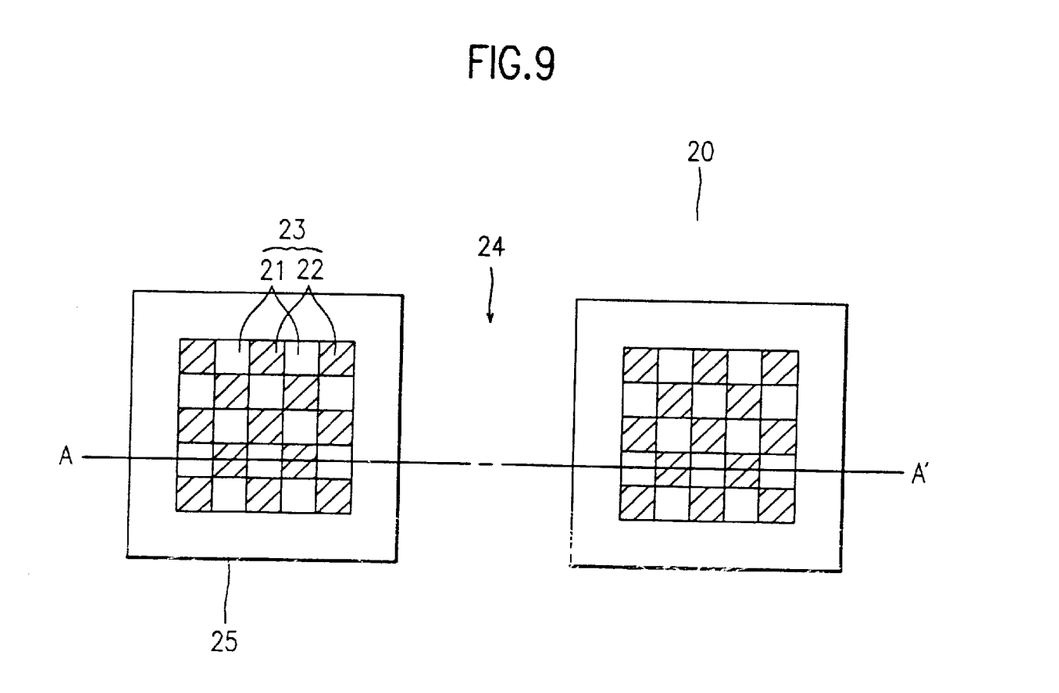
FIG. 9 is a plan view showing the phase shifting mask according to a second embodiment of the present invention.

FIG. 9 is a plan view showing the phase shifting mask according to the second embodiment of the present invention.

As shown in FIG. 9, the phase shifting mask according to the second embodiment of the present invention includes an optically transparent transmitting substrate 20, and a shielding layer pattern 23 formed by a plurality of holes 21 in the phase shifting layer and smaller phase shifting layer patterns 22 arranged in a checkerboard pattern on transmitting substrate 20 at a regular interval. Also, an opening area 24 is alternately formed to shielding layer pattern 23, and a phase shifting layer 25 is formed to encircle the shielding layer pattern 23. Shielding layer pattern 23 is provided by alternately forming holes 21 having the regular square shape and phase shifting layer patterns 22 having the regular square shape.

The holes 21 are formed to have a point symmetry state, and phase shifting layer patterns 22 also have the point symmetry state. Respective phase shifting layer holes 21 and phase shifting layer patterns 22 are in the line symmetry state. The material forming phase shifting layer 25 is, e.g., one of $SiO_2$, SOG or photosensitive polymer, which is identical to the material constituting phase shifting layer pattern 22 utilized as shielding layer pattern 23.

Here, the phase shifting mask is different from that of the first embodiment as shown in FIG. 6 in that phase shifting layer 25 is not alternately formed to opening area 24, but is formed to encircle the shielding layer pattern 23 and to always be adjacent to an opening area 24. The width of the encircling region, W, is depicted in FIG. 10C. To restate, phase shifting layer 25 is formed to the rim portion of opening area 24 utilized as the transmitting region, of which structure is similar to that of rim type phase shifting mask.

Now, referring to FIGS. 10A, 10B and 10C, a process for manufacturing the phase shifting mask according to the second embodiment of the present invention will be described.

Figure 10A:
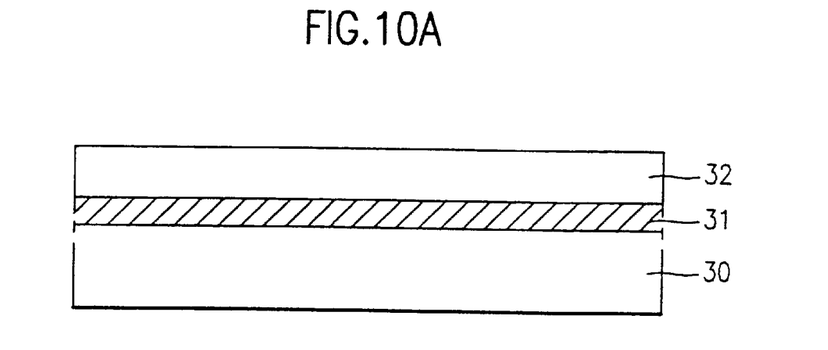
FIGS. 10A to 10C are sectional views showing a process for manufacturing the phase shifting mask, taken along line A–A' of FIG. 9.
Figure 10B:
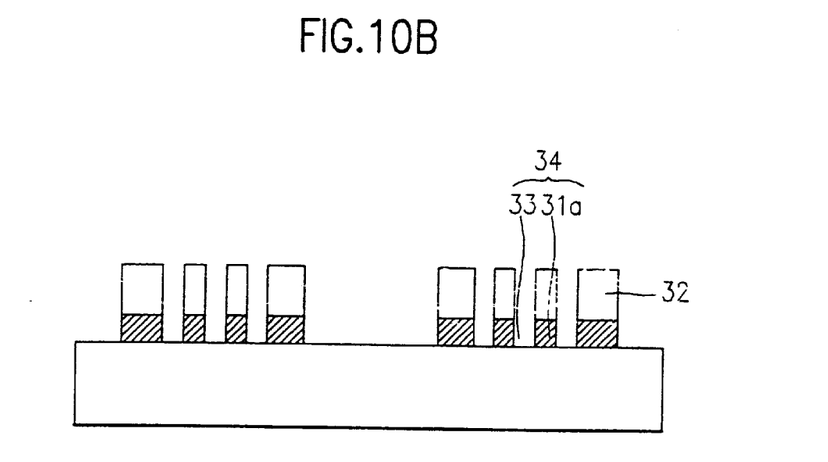
Figure 10C:
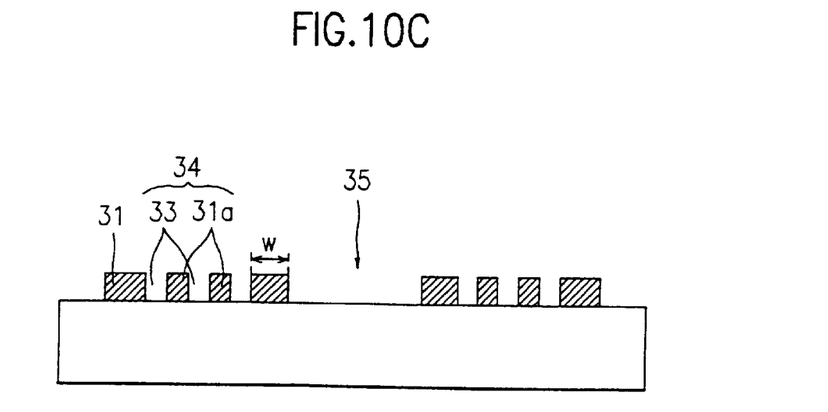

FIGS. 10A to 10C are sectional views showing a process for manufacturing the phase shifting mask, taken along line A–A' of FIG. 9.

First, as shown in FIG. 10A, a phase shifting layer 31 and a resist 32 are sequentially formed on optically transparent transmitting substrate 30.

Referring to FIG. 10B, the electron beam is selectively radiated to develop resist 32, and a shielding layer pattern and a transmitting region for exposing transmitting substrate 30 are defined. Then, phase shifting layer 31 is selectively removed via the etching process by using patterned resist 32 as the mask to form shielding layer pattern 34 (comprised of holes 33 and phase shifting layer patterns 31a). At the same time, phase shifting layer 31 of the transmitting region (other than phase shifting layer 31 which encircles shielding layer pattern 34 by a predetermined width in the transmitting region between shielding layer patterns 34) is selectively removed to form an opening area 35 utilized as the first transmitting region. Phase shifting layer 31 (formed to encircle shielding layer pattern 34) is the second transmitting region having the phase opposite to that of the light that has passed through opening area 35 (utilized as the first transmitting region without actually patterning the photoresist).

Thereafter, resist 32 is removed as shown in FIG. 10C.

More specifically, the phase shifting mask according to the second embodiment of the present invention as described above, shielding layer pattern 34 is formed by alternately forming holes 33 having the regular square shape and phase shifting layer patterns 31a having the regular square shape. Here, phase shifting layer holes 33 are formed to have the point symmetry state, and phase shifting layer patterns 31a are also have the point symmetry state. Respective holes 33 and phase shifting layer patterns 31a are in the line symmetry state. Additionally, in the second embodiment of the present invention, phase shifting layer hole 33 and phase shifting layer pattern 31a preferably are formed to have the dimensions of 0.05 μm, respectively.

Phase shifting layer 31, formed to be the rim portion of opening area 35 and so encircle shielding layer pattern 34, serves to sharpen the light profile having passed through opening area 35 and to allow for the precise patterning upon the photoresist. In other words, the intensity of the light having passed through opening area 35 (being the main transmitting region) is prevented from exhibiting significant side lobe panels due to light diffraction phenomenon, and the slope of the light intensity becomes steep to accurately form a desired pattern. Furthermore, when shielding layer pattern 34 and phase shifting layer are formed of PMMA, the phase shifting mask having the same effect can be obtained via a single electron beam exposure and development process without requiring the etching process.

Figure 11:
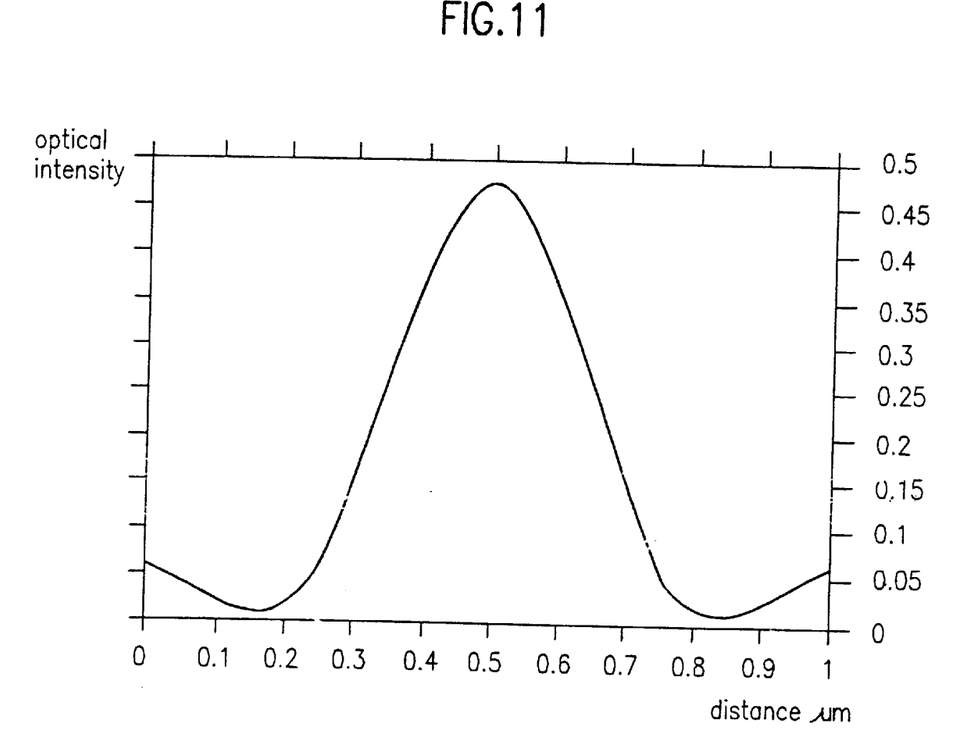
FIG. 11 shows a profile diagram representing intensity of light having passed through the phase shifting mask shown in FIG. 10C.

FIG. 11 shows a profile diagram representing intensity of light having passed through the phase shifting mask shown in FIG. 10C, which is tested by a simulation tool named as FAIM.

Here, it can be noted that the light intensity is at least as sharply distributed as that shown in FIG. 5 (which is the profile diagram of the light having passed through the conventional rim type phase shifting mask shown in FIG. 4D).

The phase shifting mask according to the present invention described as above has the following effects.

First, the phase shifting layer and shielding layer are formed only by a one-storied or single phase shifting layer on the transmitting substrate, thereby facilitating the pattern alignment and preventing the concern of bond stress induced between the shielding layer pattern and phase shifting layer, thus improving reliability of a semiconductor device.

Second, step coverage minimally occurs to enhance uniformity of the phase.

Third, the exposure, development and etching are completed by the process once, so that the process is simplified to be effective in improving yield and probable appearance of particles are lowered to the minimum.

Fourth, when forming the rim type phase shifting mask, the degradation of the reliability of the device due to the under-cut is prevented.

It will be apparent to those skilled in the art that various modifications and variations can be made in a phase shifting mask and its manufacturing method of the present invention without departing from the spirit or scope of the invention. Thus, it is intended that the present invention cover the modifications and variations of this invention provided they come within the scope of the appended claims and their equivalents.

What is claimed is:

1. A phase shifting mask comprising:
    an optically transparent transmitting substrate;
    a first checkerboard shielding layer pattern formed by a plurality of holes in a phase shifting layer and a plurality of phase shifting layer patterns constituting a checkerboard arrangement on said substrate;
    an open first area formed to a first side of said first checkerboard pattern;
    a phase shifting layer in a second area formed to a second side of said first checkerboard pattern; and
    a second checkerboard arrangement located on a side of said open first area opposite to said first checkerboard arrangement.

2. A phase shifting mask as claimed in claim 1, wherein said transmitting substrate is one of glass and quartz.

3. A phase shifting mask as claimed in claim 1, wherein said phase shifting layer pattern and phase shifting layer are formed of the same material.

4. A phase shifting mask as claimed in claim 1, wherein said phase shifting layer pattern and phase shifting layer are one of $SiO_2$, SOG and photosensitive polymer.

5. A phase shifting mask as claimed in claim 4, wherein said photosensitive polymer is PMMA.

6. A phase shifting mask as claimed in claim 1, wherein said holes and said phase shifting layer patterns of said shielding layer pattern are shaped as squares of the same size.

7. A phase shifting mask as claimed in claim 1, wherein said first area is substantially the same size as said second area.

8. A phase shifting mask as claimed in claim 7, wherein boundaries of said first checkerboard arrangement adjacent to said first area and second area, respectively, are formed such that a sum of said holes and said phase shifting layer patterns is an odd number.

9. A phase shifting mask as claimed in claim 8, wherein said boundary adjacent to said open first area has more phase shifting layer patterns than holes and said boundary adjacent to said second area has more holes than phase shifting layer patterns.

10. A phase shifting mask comprising:

an optically transparent transmitting substrate;

a checkerboard shielding pattern formed by a plurality of holes in a phase shifting layer and a plurality of phase shifting layer patterns formed on said transmitting substrate in a checkerboard arrangement at regular intervals;

an open area alternately formed to a side of said checkerboard shielding pattern; and a phase shifting layer formed adjacently to a rim portion of said open area and formed to encircle said checkerboard shielding pattern.

11. A method for manufacturing a phase shifting mask comprising the steps of:

providing an optically transparent transmitting substrate;

forming a phase shifting layer on said optically transparent transmitting substrate;

defining alternating transmitting regions and shielding regions in said phase shifting layer; and selectively patterning the phase shifting layer of said shielding regions into a first and a second checkerboard arrangement of a plurality of holes in said phase shifting layer, said holes having a point symmetry relation, and said checkerboard arrangement also including a plurality of phase shifting layer patterns having the point symmetry relation;

selectively removing the phase shifting layer to form an open first area between said first and second checkerboard arrangements; and retaining said phase shifting layer in a second area to a side of one of said first and second checkerboard arrangements opposite to said open first area.

12. A method for manufacturing a phase shifting mask as claimed in claim 11, wherein said holes and said phase shifting layer patterns are formed to have dimensions of 0.05 μm, respectively.

13. A method for manufacturing a phase shifting mask as claimed in claim 11, wherein, assuming that the vertical and horizontal lengths of said shielding layer patterns are the same, and a length of one side is designated by L, a wavelength of a light source is designated by λ and the numerical aperture of lens is designated by N·A, said length of one side of said shielding layer pattern is:

$$L = \frac{0.4\lambda}{N \cdot A} \sim \frac{0.1\lambda}{N \cdot A}.$$

14. A method for manufacturing a phase shifting mask as claimed in claim 11, wherein for a cross-section of said phase shifting mask, a width of said second area of said shielding layer pattern on one side of said checkerboard arrangement added to a width of said open first area on the other side of said checkerboard arrangement results in a sum that is less than 0.6 μm.

15. A method for manufacturing a phase shifting mask as claimed in claim 11, wherein said first area is substantially the same size as said second area.

16. A method for manufacturing a phase shifting layer comprising the steps of:

providing an optically transparent transmitting substrate;

forming a phase shifting layer on said optically transparent transmitting substrate;

defining shielding regions and transmitting regions in said phase shifting layer; and selectively patterning the phase shifting layer of said shielding regions into a checkerboard arrangement of a plurality of holes in said phase shifting layer having a point symmetry relation and a plurality of phase shifting layer patterns having the point symmetry relation; and selectively removing an outer portion of the phase shifting layer on the transmitting regions except for selected portions of said phase shifting layer which encircle said checkerboard arrangement.

17. A method for manufacturing a phase shifting layer as claimed in claim 16, wherein, assuming that a width of said phase shifting layer encircling said shielding layer pattern is consistent, said width is designated by W, a wavelength of a light source is designated by λ and the numerical aperture of lens is designated by NA, the following equation is satisfied:

$$W = 0.2 \frac{\lambda}{NA}.$$

18. A method for manufacturing a phase shifting layer as claimed in claim 16, wherein said outer portion of said phase shifting layer is removed at the same time as said checkerboard arrangement is selectively patterned.

\* \* \* \* \*